(12) United States Patent
Bucksch

(10) Patent No.: US 7,715,257 B2
(45) Date of Patent: May 11, 2010

(54) TEST METHOD AND SEMICONDUCTOR DEVICE

(75) Inventor: Thorsten Bucksch, Munich (DE)

(73) Assignee: Qimonda AG, Munich (DE)

( * ) Notice: Subject to any disclaimer, the term of this patent is extended or adjusted under 35 U.S.C. 154(b) by 300 days.

(21) Appl. No.: 11/928,790

(22) Filed: Oct. 30, 2007

(65) Prior Publication Data

US 2009/0109774 A1 Apr. 30, 2009

(30) Foreign Application Priority Data

Oct. 30, 2006 (DE) .................. 10 2006 051 135

(51) Int. Cl.
*G11C 7/00* (2006.01)
(52) U.S. Cl. .............. 365/201; 365/200; 365/189.07
(58) Field of Classification Search ............ 365/201, 365/200, 189.011, 189.07; 714/743, 744
See application file for complete search history.

(56) References Cited

U.S. PATENT DOCUMENTS

| 5,844,913 A | * | 12/1998 | Hassoun et al. ............. 714/718 |
| 5,977,775 A | * | 11/1999 | Chandler et al. ............ 324/537 |
| 6,298,465 B1 | * | 10/2001 | Klotchkov .................. 714/814 |
| 6,785,858 B2 | * | 8/2004 | Niiro .......................... 714/744 |
| 2004/0124852 A1 | * | 7/2004 | Higashide et al. ........... 324/617 |
| 2006/0156149 A1 | * | 7/2006 | Logisch et al. .............. 714/744 |

FOREIGN PATENT DOCUMENTS

DE 19938060 A1 3/2001

* cited by examiner

*Primary Examiner*—Gene N. Auduong
(74) *Attorney, Agent, or Firm*—Dicke, Billig & Czaja, PLLC

(57) ABSTRACT

A test method and a semiconductor device is disclosed. One embodiment provides sending out a test signal by a semiconductor device. A reflected signal generated in reaction is compared to the test signal with a first threshold value. The reflected signal is compared with a second threshold value differing from the first threshold value.

20 Claims, 4 Drawing Sheets

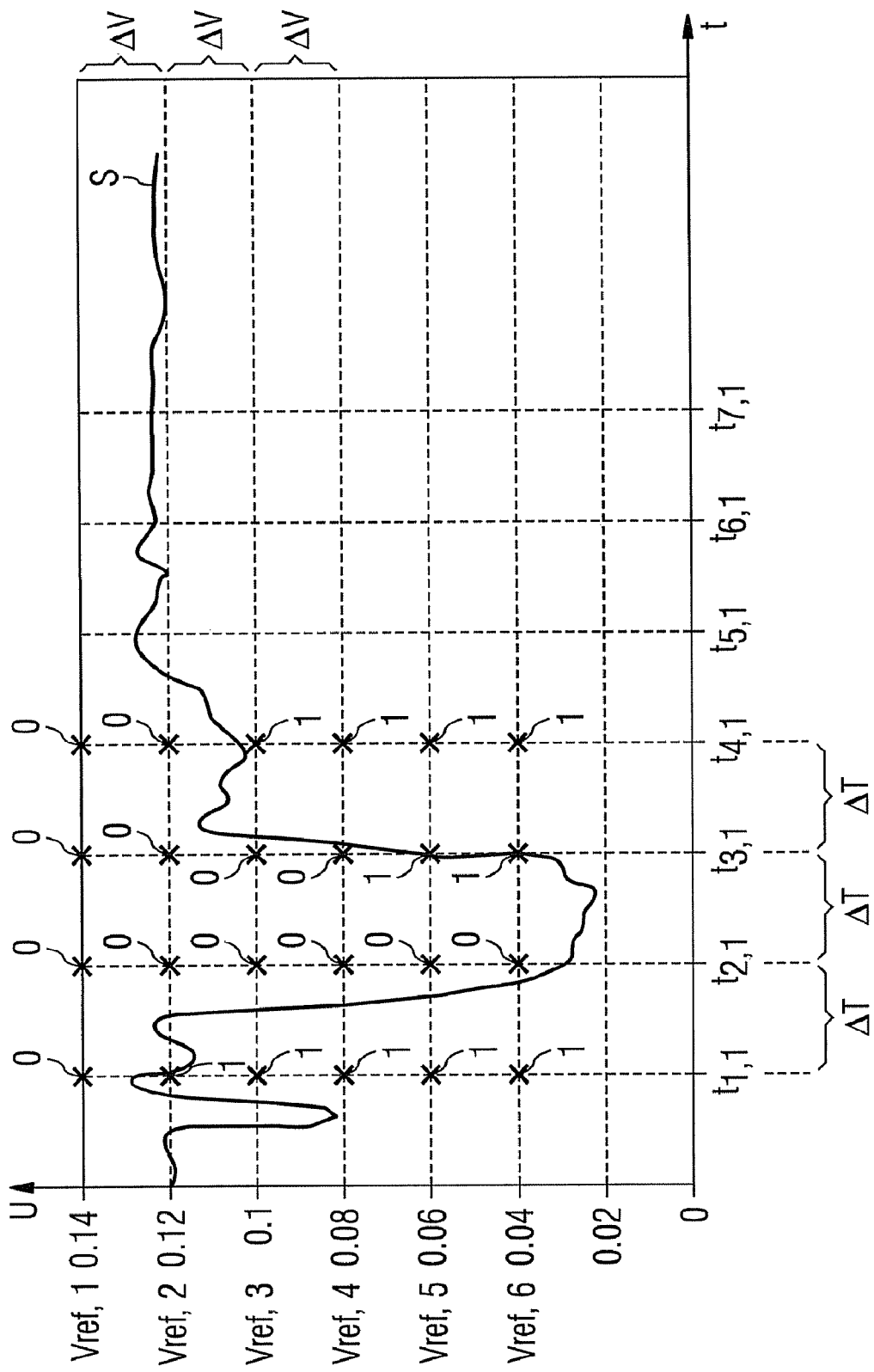

TEST METHOD AND SEMICONDUCTOR DEVICE

CROSS-REFERENCE TO RELATED APPLICATIONS

This Utility Patent Application claims priority to German Patent Application No. DE 10 2006 051 135.2 filed on Oct. 30, 2006, which is incorporated herein by reference.

BACKGROUND

The invention relates to a test method, a test device, as well as to a semiconductor device, in one embodiment a data buffer device, and to a memory module.

Semiconductor devices, e.g., corresponding, integrated (analog or digital) computing circuits, semiconductor memory devices such as, for instance, functional memory devices (PLAs, PALs, etc.) and table memory devices (e.g., ROMs or RAMs, in one embodiment SRAMs and DRAMs), etc. are subject to comprehensive tests during and after their manufacturing process.

For the common manufacturing of a plurality of (in general identical) semiconductor devices, a wafer (i.e. a thin disc of monocrystalline silicon) is used. The wafer is processed appropriately (e.g., subject successively to a plurality of coating, exposure, etching, diffusion, and implantation process, etc.), and subsequently sawn apart (or e.g., scratched, and broken), so that the individual devices are then available.

During the manufacturing of semiconductor devices (e.g., of DRAMs (Dynamic Random Access Memories or dynamic write-read memories)), in one embodiment of DDR-DRAMs (Double Data Rate-DRAMs)—even before all the desired, above-mentioned processing were performed on the wafer— (i.e. already in a semi-finished state of the semiconductor devices) the (semi-finished) devices (that are still available on the wafer) may be subject to appropriate test methods at one or a plurality of test stations by using one or a plurality of test devices (e.g., kerf measurements at the wafer kerf).

After the finishing of the semiconductor devices (i.e. after the performing of all the above-mentioned wafer processing), the semiconductor devices are subject to further test methods at one or a plurality of (further) test stations—for instance, by using appropriate (further) test devices, the finished devices—that are still available on the wafer—may be tested appropriately (so-called "wafer tests").

Correspondingly, one or a plurality of further tests (at corresponding further test stations, and by using appropriate, further test devices) may be performed, for instance, after the incorporation of the semiconductor devices in the corresponding semiconductor device packages, and/or e.g., after the incorporation of the semiconductor device packages (along with the respectively included semiconductor devices) in corresponding electronic modules, e.g., memory modules (so-called "module tests").

In a plurality of applications—e.g., in server or workstation computers, etc.—memory modules with upstream data buffer devices (so-called buffers) may be used, e.g., "buffered" or "registered" DIMMs, FB-DIMMs (FB-DIMM=Fully Buffered DIMM), etc.

Such memory modules include in general one or a plurality of semiconductor memory devices, in one embodiment DRAMs, and—upstream of the semiconductor memory devices—one or a plurality of data buffer devices (which may, for instance, be arranged on the same printed circuit board as the DRAMs).

The memory modules are in one embodiment by interconnecting an appropriate memory controller (which is, for instance, positioned externally of the respective memory module)—connected with one or a plurality of microprocessors of the respective server or workstation computer, etc.

Caused by the upstream arrangement of the data buffer devices (buffers), it is possible to perform the above-mentioned conventional module tests only in a very restricted scope in the above-mentioned "registered" DIMMs, FB-DIMMs, etc. One reason for this is that the signals exchanged between a respective buffer and the DRAMs are not accessible from outside. Therefore, the quality of the connections between the buffer and the DRAMs can, for instance, only be tested indirectly by using conventional test methods.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 4 illustrates an exemplary progression of a jump response signal evaluated by the test device illustrated in FIG. 3.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One or more embodiments provide a test method, a test device, as well as a semiconductor device, in one embodiment a data buffer device, and a memory module.

In accordance with one embodiment there is provided a test method. The method includes:
(a) sending out a test signal by a semiconductor device, in one embodiment a data buffer device;
(b) comparing a reflected signal generated in reaction to the test signal with a first threshold value; and
(c) comparing the reflected signal with a second threshold value differing from the first threshold value.

The test signal sent out by the semiconductor device, in one embodiment data buffer device, may include at least one test pulse, in one embodiment a plurality of test pulses.

In one embodiment, the test method includes:
comparing the reflected signal with the first threshold value at a first point in time after sending out a test pulse; and
comparing the reflected signal with the first threshold value at a second point in time differing from the first point in time after sending out the test pulse or a further test pulse.

In one or more embodiments, the test method may additionally include:
comparing the reflected signal with the second threshold value at the first point in time; and
comparing the reflected signal with the second threshold value at the second point in time differing from the first point in time.

Thus, a "Time Domain Reflection" (TDR) method can in a simple manner be performed—in one embodiment with a data buffer element that has already been incorporated in a corresponding memory module—and thus, for instance, the quality of a connection between the data buffer device and a memory device provided on the memory module can be tested.

Figure 1:
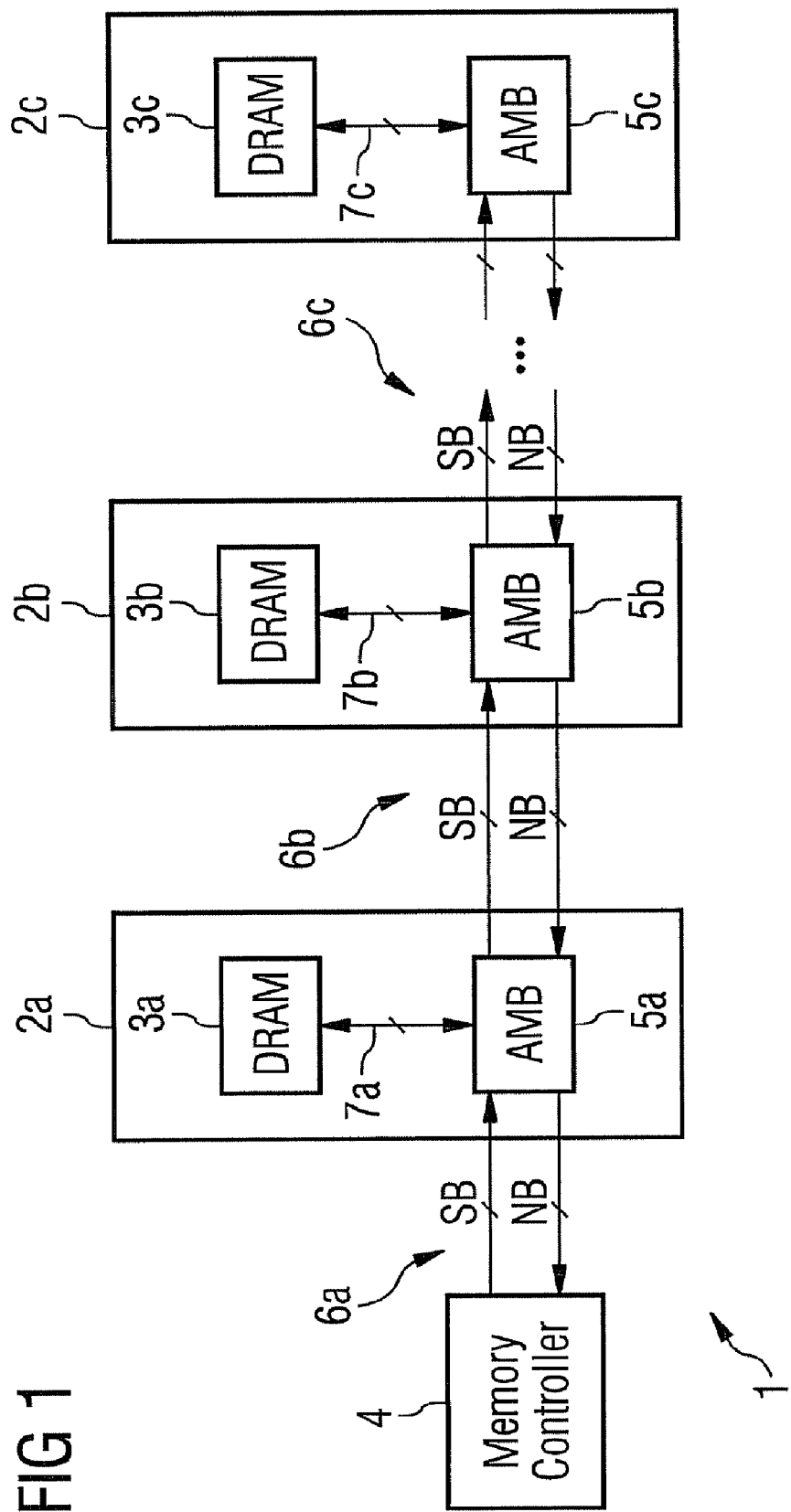
FIG. 1 illustrates a schematic representation of a memory module system in which a test method in accordance with one embodiment can be used.

FIG. 1 illustrates by way of example a memory module system 1 in which a test method in accordance with one embodiment can be used.

As results from FIG. 1, and as will be explained in more detail in the following, the memory module system 1 includes a plurality of memory modules 2a, 2b, 2c with upstream data buffer devices (buffers) (here: a plurality of FB-DIMMs (FB-DIMM=Fully Buffered DIMM)).

In the system 1 illustrated in FIG. 1, up to eight memory modules/FB-DIMMs 2a, 2b, 2c per channel can be connected to a corresponding CPU or memory controller 4, respectively.

Each memory module/FB-DIMM 2a, 2b, 2c includes a data buffer device (buffer) 5a, 5b, 5c, and a plurality of DRAMs 3a, 3b, 3c, e.g., DDR2-DRAMs (for reasons of better presentability, only one DRAM 3a, 3b, 3c per FB-DIMM 2a, 2b, 2c is illustrated in FIG. 1).

The FB-DIMMs 2a, 2b, 2c may be plugged into appropriate memory plug contacts of a motherboard which, for instance, also includes the above-mentioned CPU or memory controller 4, respectively.

As results from FIG. 1, the CPU/memory controller 4 is connected to the first FB-DIMM 2a (more exactly: its buffer 5a) via a first bus 6a which includes a first channel ("south-bound channel" (SB channel)) and a second channel ("north-bound channel" (NB channel)). The SB channel of the bus 6a is used to send corresponding address, control, and data signals from the CPU/memory controller 4 to the first FB-DIMM 2a. Correspondingly similar, the NB channel of the bus 6a is used to send corresponding signals from the first FB-DIMM 2a to the CPU/memory controller 4.

As results further from FIG. 1, the first FB-DIMM 2a (more exactly: its buffer 5a) is connected to the second FB-DIMM 2b (more exactly: its buffer 5b) via a second bus 6b which includes, like the first bus 6a, a first channel ("south-bound channel" (SB channel)) and a second channel ("north-bound channel" (NB channel)). Correspondingly similar, the second FB-DIMM 2b (more exactly: its buffer 5b) is connected to a third FB-DIMM (more exactly: its buffer) via a third bus 6c (which also includes a first channel ("south-bound channel" (SB channel)) and a second channel ("north-bound channel" (NB channel)), etc.

The SB channel of the bus 6b is used to send corresponding address, control, and data signals from the first FB-DIMM 2a to the second FB-DIMM 2b. Correspondingly similar, the NB channel of the bus 6b is used, to send corresponding signals from the second FB-DIMM 2b to the first FB-DIMM 2a, etc.

In normal operation of the memory module system 1, the FB-DIMMs 2a, 2b, 2c operate corresponding to the "daisy chain" principle:

The buffer 5a of the first FB-DIMM 2a (i.e. the first link of the "daisy chain") transmits corresponding data, address, and/or control signals sent from the CPU/memory controller 4 via the "south-bound channel" of the first bus 6a to the first FB-DIMM 2a—irrespective of whether the first FB-DIMM 2a or another FB-DIMM is addressed with the signals—via the "south-bound channel" of the second bus 6b to the buffer 5b of the second FB-DIMM 2b (i.e. the second link of the "daisy chain").

Correspondingly similar, the buffer 5b of the second FB-DIMM 2b transmits the corresponding data, address, and/or control signals received from the buffer 5a of the first FB-DIMM 2a—irrespective of whether the second FB-DIMM 2b or another FB-DIMM is addressed with the signals—via the "south-bound channel" of the third bus 6c to the buffer of the third FB-DIMM (i.e. the third link of the daisy chain), etc.

Correspondingly vice versa, the buffer 5b of the second FB-DIMM 2b transmits corresponding signals received from the buffer of the third FB-DIMM via the "north-bound channel" of the third bus 6c to the buffer 5a of the first FB-DIMM 2a via the "north-bound channel" of the second bus 6b.

The buffer 5a of the first FB-DIMM 2a transmits—in a correspondingly similar manner—the corresponding signals received from the buffer 5b of the second FB-DIMM 2b via the "north-bound channel" of the second bus 6b to the CPU/memory controller 4 via the "north-bound channel" of the first bus 6a.

As is further illustrated in FIG. 1, every DRAM 3a, 3b, 3c is, via a corresponding bus 7a, 7b, 7c, connected to the corresponding buffer 5a, 5b, 5c of the respective FB-DIMM 2a, 2b, 2c.

Every buffer 5a, 5b, 5c knows its position in the ("daisy") chain. Which of the FB-DIMMs 2a, 2b, 2c is just being addressed by the CPU/memory controller 4, may be determined in the respective buffer 5a, 5b, 5c e.g., by comparing identification data (ID number or slot number) stored in the corresponding buffer 5a, 5b, 5c with identification data sent by the CPU/memory controller 4 via the busses 6a, 6b, 6c and individually characterizing the respective buffer.

The buffer of a respectively addressed FB-DIMM transmits the data, address, and/or control signals received via a corresponding "south-bound channel" of the busses 6a, 6b, 6c not just, as described above, to the respectively next link of the above-mentioned "daisy chain" (i.e. to the buffer that follows next in the "daisy chain"), but—possibly in a converted form—via the respective bus 7a, 7b, 7c also to the DRAMs 3a, 3b, 3c of the respectively addressed FB-DIMM 2a, 2b, 2c. Furthermore, signals received by a corresponding buffer 5a, 5b, 5c via the respective bus 7a, 7b, 7c from an addressed DRAM are—possibly in a converted form—transmitted from the respective buffer 5a, 5b, 5c via a corresponding "north-bound channel" of the busses 6a, 6b, 6c to the respectively preceding link of the above-mentioned "daisy chain" (i.e. to the buffer that precedes in the "daisy chain", or—from the buffer 5a of the first FB-DIMM—to the CPU/memory controller 4).

Figure 2:
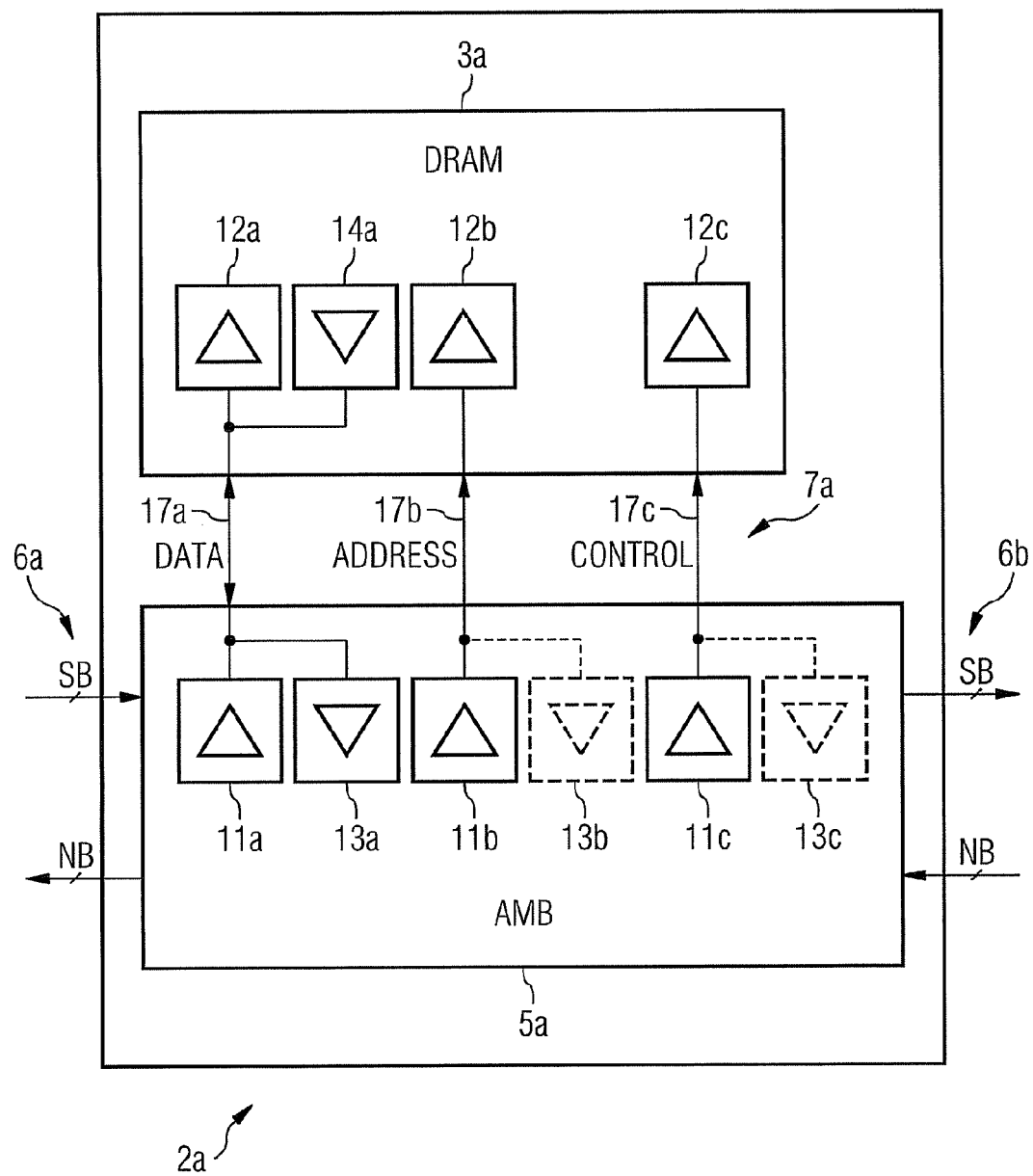
FIG. 2 illustrates a schematic representation of a memory module that can be used in the memory module system illustrated in FIG. 1.

For transmitting the above-mentioned data, address, and/or control signals to the DRAMs 3a, 3b, 3c, the buffers 5a, 5b, 5c include a plurality of driver 11a, 11b, 11c ("drivers"), as is illustrated in FIG. 2.

Each driver 11a of a first group of driver is connected with a corresponding data line 17a of a plurality of data lines of the bus 7a (for reasons of better presentability, only one single driver 11a of the first group of driver and only one single data line 17a are illustrated in FIG. 2).

Correspondingly similar, each driver 11b of a second group of driver is connected with a corresponding address line 17b of a plurality of address lines of the bus 7a (for reasons of better presentability, only one single driver 11b of the second group of driver and only one single address line 17b are illustrated in FIG. 2).

Furthermore, each driver 11c of a third group of driver is connected with a corresponding control line 17c of a plurality of control lines of the bus 7a (for reasons of better presentability, only one single driver 11c of the third group of driver and only one single control line 17b are illustrated in FIG. 2).

As results from FIG. 2, the DRAMs 3a, 3b, 3c include a plurality of receiver 12a, 12b, 12c ("receivers") for receiving the data, address, and/or control signals sent by a respective buffer 5a, 5b, 5c via the above-mentioned data, address, and control lines 17a, 17b, 17c.

Each receiver 12a of a first group of receiver is connected with a corresponding data line 17a of the plurality of data lines of the bus 7a.

Correspondingly similar, each receiver 12b of a second group of receiver is connected with a corresponding address line 17b of the plurality of address lines of the bus 7a, and each receiver 12c of a third group of receiver is connected with a corresponding control line 17c of the plurality of control lines of the bus 7a.

As results from FIG. 2, the data lines 17a of the bus 7a are operated bidirectionally with the FB-DIMMs 2a—like with conventional FB-DIMMs—(depending on whether the data are written in a corresponding DRAM 3a or read out therefrom).

For this reason, in the buffers 5a, 5b, 5c—parallel to the buffer driver 11a ("drivers") connected with the above-mentioned data lines 17a—corresponding receiver 12a, 12b, 12c ("receivers")—which are also connected with the data lines 17a—are provided (and in the DRAMs 3a, 3b, 3c—parallel to the DRAM receiver 12a ("receivers") connected with the above-mentioned data lines 17a—corresponding driver 14a ("drivers")—which are also connected with the data lines 17a).

As results further from FIG. 2, the address and control lines 17b, 17c of the bus 7a are operated unidirectionally with the FB-DIMMs 2a—like with conventional FB-DIMMs—in normal operation of the FB-DIMMs 2a, but when the test method that is explained in more detail below is performed (i.e. in the test operation), they are operated bidirectionally—other than with conventional FB-DIMMs, and in the specific manner described in more detail in the following.

For this reason, in the buffers 5a, 5b, 5c,—as is illustrated in dashed lines in FIG. 2 (and other than with conventional buffers of conventional FB-DIMMs)—parallel to the buffer driver 11b ("drivers") connected with the above-mentioned address lines 17b—corresponding receiver 13b ("receivers")—which are also connected with the address lines 17b— are provided, and parallel to the buffer driver 11c ("drivers") which are connected with the above-mentioned control lines 17c, corresponding receiver 13c ("receivers")—which are also connected with the control lines 17c—are provided.

Figure 3:
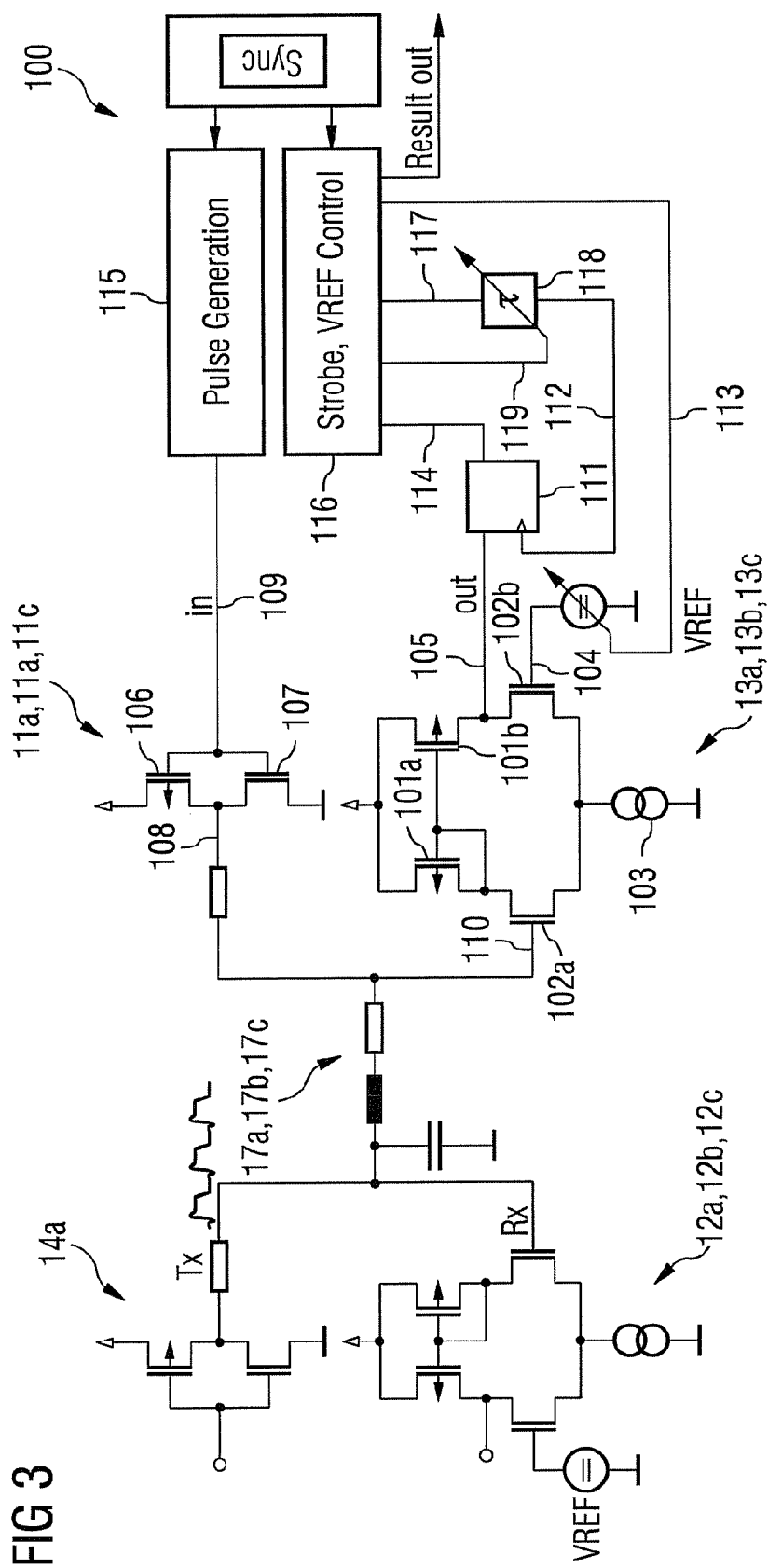
FIG. 3 illustrates a schematic detailed representation of a section of the DRAM illustrated in FIG. 2, of the buffer illustrated in FIG. 2, and of a test device for performing the test method in accordance with one embodiment.

FIG. 3 schematically illustrates a test device 100 for performing the test method in accordance with the embodiment of the invention, and a section of the DRAM 3a illustrated in FIG. 2, and a section of the buffer 5a illustrated in FIG. 2 (in one embodiment the DRAM receiver 12a, 12b, 12c and DRAM driver 14a illustrated there, and the buffer receiver 13a, 13b, 13c and buffer driver 11a, 11b, 11c).

The DRAM and buffer receiver 12a, 12b, 12c, 13a, 13b, 13c may, like conventional receivers, comprise, for instance, four transistors, e.g., a first and a second p-channel field effect transistor 101a, 101b (e.g., two p-channel MOSFETs), and a first and a second n-channel field effect transistor 102a, 102b (e.g., two n-channel MOSFETs).

The source of the first n-channel field effect transistor 102 may, via corresponding lines, be connected to a (direct or constant) current source that is connected with the ground potential. Correspondingly, the source of the second n-channel field transistor 102b may, via corresponding lines, also be connected to the (direct or constant) current source that is connected with the ground potential.

Furthermore, the gate of the first n-channel field effect transistor 102a may, via a line 110, be connected to the corresponding data, address, or control line (i.e. one of the above-mentioned lines 17a, 17b, 17c), and the gate of the second n-channel field effect transistor 102b, for instance, to a line 104 to which—as will be explained in more detail in the following—a (variably modifiable) reference voltage Vref may be applied.

The intensity of the level of the reference voltage Vref present at the line 104 may be variably adjusted by a control signal present at a control line 113 and output by a test control device 116 of the test device 100.

In one embodiment, the intensity of the level of the reference voltage Vref is left constant during the above-mentioned normal operation of the FB-DIMM 2a and is only modified in the manner explained in detail below during the test operation of the FB-DIMM 2a—i.e. during the performing of the above-mentioned test method.

As results further from FIG. 3, the drain of the first n-channel field effect transistor 102 may, via corresponding lines, be connected to the gate of the first and second p-channel field effect transistors 101a, 101b, and to the drain of the first p-channel field effect transistor 101a.

Furthermore, the drain of the second n-channel field effect transistors 102b may be connected to the drain of the second p-channel field effect transistor 101b, and to a line 105, i.e. an output of the receiver (at which a corresponding—digital—output signal out may be tapped).

The source of the first and second p-channel field effect transistors 101a, 101b may each be connected to a corresponding supply voltage.

By the receiver 13a, 13b, 13c, an analog (input) signal present at the line 110 is converted to the—digital—output signal 105 output at the line 105 (which is—depending on whether the signal level of the input level lies above or below a predetermined threshold value—"logic high" or "logic low").

The predetermined threshold value depends on the respective level intensity of the reference voltage Vref present at the line 104, i.e. may be modified variably.

As results further from FIG. 3, the DRAM and buffer driver 11a, 11b, 11c, 14a may, like conventional drivers, comprise, for instance, two transistors, e.g., a p-channel field effect transistor 106 (e.g., a p-channel MOSFET), and an n-channel field effect transistor 107 (e.g., an n-channel MOSFET).

The source of the n-channel field effect transistor 107 may, via a corresponding line, be connected to the above-mentioned ground potential. The drain of the n-channel field effect transistor 107 may be connected to the drain of the p-channel field effect transistor 106, and, via a line 108, to the corresponding data, address, or control line (i.e. the above-mentioned line 17a, 17b, 17c).

As results further from FIG. 3, the source of the p-channel field effect transistor 106 may be connected to the supply voltage.

The gates of the p-channel field effect transistor 106 and of the n-channel field effect transistor 107 may be connected with each other and be coupled to a line 109 (to which a corresponding input signal may be applied).

During the above-mentioned test operation of the FB-DIMM 2a, a discrete "Time Domain Reflection" (TDR) method is performed by using the above-mentioned test device 100:

In so doing—controlled by the test device 100—the driver 11a, 11b, 11c of the buffer 5a outputs a corresponding test pulse at the line 17a, 17b, 17c. To this end, it is induced that the input signal input in the driver 11a, 11b, 11c at the line 109 suddenly changes its state, for instance, from "logic high" to "logic low" (or vice versa). Consequently, a signal output by the driver 11a, 11b, 11c at the above-mentioned line 108 that is connected with the line 17a, 17b, 17c suddenly changes its state, for instance, from "logic low" to "logic high" (or vice versa).

The test pulse generated thereby is transmitted from the driver 11a, 11b, 11c via the line 17a, 17b, 17c in the direction of the DRAM 3a, and is reflected in one embodiment, for instance, at the DRAM 3a or, for instance, in the case of a defective line 17a, 17b, 17c, at least partially before already, namely at the corresponding defect, etc.

For minimizing the reflection at the DRAM 3a, the line 17a, 17b, 17c may be terminated appropriately, i.e. be terminated with the wave resistance of the line 17a, 17b, 17c.

The reflected pulse received by the receiver 13a, 13b, 13c of the buffer 5a ("jump-response-signal") is evaluated by the test device 100 in the manner explained in more detail below.

By the evaluation of the jump-response-signal, the impedance profile of the line 17a, 17b, 17c may be determined. By this, the quality of the connection between the buffer 5a and the DRAM 3a which is generated by the line 17a, 17b, 17c may be tested, and corresponding faults—e.g., soldering faults, short-circuits, etc.—may be detected and located.

FIG. 4 illustrates—by way of example—a possible progression of a jump-response-signal S which is to be evaluated by the test device 100 illustrated in FIG. 3 and which is present at the line 110, i.e. at the receiver 13a, 13b, 13c of the buffer 5a.

The relatively low voltage level of the jump-response-signal S between, for instance, a point in time t2,1 and a point in time t3,1 as illustrated in FIG. 4 may, for instance, indicate a short-circuit on the line 17a, 17b, 17c (and the point in time of the occurrence of the relatively low voltage level may indicate the fault place).

As already explained above, the receiver 13a, 13b, 13c converts the analog (input) signal present at the line 110—during the test operation of the FB-DIMM 2a thus the above-mentioned jump-response-signal S—to the—digital—output signal out which is output at the line 105 (which is—depending on whether the signal level of the input signal lies above or below the above-mentioned predetermined, variably modifiable threshold value—"logic high" or "logic low").

As results from FIG. 3, the digital output signal out which is output at the line 105 is supplied to a data input of a flip-flop 111.

A corresponding clock signal is supplied to the flip-flop 111—more exactly: its clock input—via a clock line 112.

The state of the signal output at a line 114, i.e. at an output of the flip-flop 111, depends on the state of the digital signal out present at the line 105 at the point in time of a clock edge of the clock signal supplied to the clock input of the flip-flop 111: If the state of the digital signal out present a the line 105 is "logic high" at the point in time of a clock edge of the clock signal ("signal scanning time"), a "logic high" signal, i.e. a "1" (or in another embodiment a "logic low" signal, i.e. a "0") is output at the line 114, i.e. at the output of the flip-flop. If, contrary to this, the state of the digital signal out present at the line 105 is "logic low" at the point in time of a clock edge of the clock signal ("signal scanning time"), a "logic low" signal, i.e. a "0" (or a "logic high" signal, i.e. a "1") is output at the line 114, i.e. at the output of the flip-flop. Up to the next clock edge, the state of the flip-flop, and thus the state of the signal output at the line 114, remain "frozen".

For performing the above-mentioned test method (i.e. in the test operation of the FB-DIMM 2a), a plurality of the above-mentioned test pulses are successively—in respective equidistant time intervals—transmitted from the driver 11a, 11b, 11c via the line 17a, 17b, 17c in the direction of the DRAM 3a, and the reflected pulses ("jump-response-signals") are evaluated by the receiver 13a, 13b, 13c of the buffer 5a and the flip-flop 111 in the above-described manner.

For generating the above-mentioned test pulses, a corresponding (periodic) pulse sequence is generated by a pulse generation 115 of the test device 100, and is applied to the line 109 as input signal in the driver 11a, 11b, 11c.

As is illustrated in FIG. 4, each of the reflected pulses ("jump-response-signals") is evaluated by using a respectively other reference voltage Vref,1, Vref,2, Vref,3, Vref,4, etc. present at the line 104, i.e. at the receiver 13a, 13b, 13c (i.e. a respectively other receiver threshold value), and a respectively other signal scanning time (i.e. at (scanning) points in time t1,1, t2,1, t3,1, t4,1, etc. that are respectively different with respect to, for instance, the point in time of the beginning of the sending out of a test pulse) (or, for instance, at (scanning) points in time that are respectively different with respect to, for instance, the point in time of corresponding positive and/or negative clock edges of a system clock, etc.)).

For variation of the signal scanning time, the point in time of the occurrence of a clock edge of the clock signal supplied to the clock input of the flip-flop 111 is varied (e.g., with respect to, for instance, the point in time of the beginning of the sending out of a test pulse).

To this end, a corresponding—periodic—clock signal may be output by the test control 116 at a clock line 117, which is supplied to a delay 118, is impacted by same with a variably adjustable delay time, and is transmitted to the clock line 112, i.e. the clock input of the flip-flop 111.

The delay time of the delay 118 may be variably adjusted by a control signal present at a control line 119 and output by the test control 116.

As is illustrated in FIG. 4, a first one of the above-mentioned reflected pulses may, for instance, be evaluated by using a first reference voltage Vref,1 and at a first (scanning) point in time t1,1, a second reflected pulse, for instance, also by using the first reference voltage Vref,1 and at a second (scanning) point in time t2,1—that is later by a duration ΔT vis-à-vis the first (scanning) point in time t1,1—, a third reflected pulse, for instance, also by using the first reference voltage Vref,1 and at a third (scanning) point in time t3,1— that is later by a duration ΔT vis-à-vis the second (scanning) point in time (and by a duration 2ΔT vis-à-vis the first (scanning) point in time t1,1)), etc.

In the progression of the jump-response-signal S illustrated in FIG. 4—as a result of the evaluation for the first reflected pulse—a "0" is, for instance, output at the output of the flip-flop 111, i.e. at the line 114, subsequently—as a result of the evaluation for the second reflected pulse—again a "0", and then—as a result of the evaluation for the third reflected pulse—again a "0", etc.

Subsequently, the intensity of the reference voltage present at the line 104, i.e. at the receiver 13a, 13b, 13c, is reduced, e.g., by a voltage intensity ΔV (so that a second, modified reference voltage Vref,2 will then be present at the line 104).

As is illustrated in FIG. 4, a further of the above-mentioned reflected pulses may then, for instance, by using the second reference voltage Vref,2, and at the above-mentioned first (scanning) point in time t1,1 be evaluated, a subsequent reflected pulse, for instance, also by using the second reference voltage Vref,2, and at the above-mentioned second (scanning) point in time t2,1—which is by the above-mentioned duration ΔT later vis-à-vis the first (scanning) point in time t1,1—, a next following reflected pulse, for instance, also by using the second reference voltage Vref,2, and at the above-mentioned third (scanning) point in time t3,1, etc.

In the progression of the jump-response-signal S illustrated in FIG. 4, a "1" is then output—as a result of the evaluation for the above-mentioned further reflected pulse—at the output of the flip-flop 111, subsequently—as a result of the evaluation for the subsequent reflected pulse—a "0", and then—as a result of the evaluation for the next following reflected pulse—again a "0", etc.

Next, the intensity of the reference voltage present at the line 104, i.e. at the receiver 13a, 13b, 13c, is modified again (e.g., again reduced by the above-mentioned voltage intensity ΔV, so that a third, newly modified reference voltage Vref,3 will then be present at the line 104).

As is illustrated in FIG. 4, a next following of the above-mentioned reflected pulses may, for instance, be evaluated by using the third reference voltage Vref,3, and at the above-mentioned first (scanning) point in time t1,1, a subsequent reflected pulse, for instance, also by using the third reference voltage Vref,3, and at the above-mentioned second (scanning) point in time t2,1—which is by the above-mentioned duration ΔT later vis-à-vis the first (scanning) point in time t1,1—, etc.

In the progression of the jump-response-signal S illustrated in FIG. 4, a "1" is then output—as a result of the evaluation for the above-mentioned next following reflected pulse—at the output of the flip-flop 111, i.e. at the line 114, subsequently—as a result of the evaluation for the subsequent reflected pulse—a "0", etc.

In one or more embodiments, each of the reflected pulses may be evaluated, instead at a single scanning point in time, also at several scanning point in time, e.g., at two, three, or more than three different scanning points in time.

A first reflected pulse may, for instance, be evaluated by using a first reference voltage Vref,1, and at a first (scanning) point in time t1,1 and, also by using the first reference voltage Vref,1, at a second (scanning) point in time t2,1—which is by a duration ΔT later vis-à-vis the first (scanning) point in time t1,1—, and at a third (scanning) point in time t3,1—which is by a duration ΔT later vis-à-vis the second (scanning) point in time t2,1 (and by a duration 2ΔT later vis-à-vis the first (scanning) point in time t1,1) (also by using the first reference voltage Vref,1), etc. Correspondingly, a second reflected pulse following the first reflected pulse may, for instance, be evaluated—by using the above-mentioned second reference voltage Vref,2—at the above-mentioned first (scanning) point in time t1,1 and at the second (scanning) point in time t2,1—which is by a duration ΔT later vis-à-vis the first (scanning) point in time t1,1—, and at the third (scanning) point in time t3,1—which is also by a duration ΔT later vis-à-vis the second (scanning) point in time t2,1, etc.

The digital series of numbers output by the flip-flop 111 at the line 114 may, for instance, be stored in a shift register provided on the buffer 5a, 5b, 5c, and the stored series of numbers may be read out in the above-mentioned test operation by a device provided externally of the buffer 5a, 5b, 5c, e.g., an external test device.

The above-mentioned test device 100—controlling the test method—, in one embodiment the pulse generation 115 and/or the test control 116, may, for instance, be provided on the buffer 5a, 5b, 5c itself and be activated in the above-mentioned test operation.

In one embodiment, the test device 100 may, for instance, also be provided on a test device that is provided externally of the buffer 5a, 5b, 5c. The above-mentioned signals to be applied by the test device 100 to the lines 109, 113, 117, 119 in the test operation of the FB-DIMM/the buffer 5a, 5b, 5c, may then be input by the test device 100 via corresponding pins of the buffer 5a, 5b, 5c in the buffer 5a, 5b, 5c and be transmitted to the lines 109, 113, 117, 119 (in one embodiment, for instance, via pins through which, in normal operation, the above-mentioned (data, address, and/or control) signals are input via the above-mentioned "south-bound channel" of the first bus 6a or the above-mentioned "north-bound channel" of the second bus 6b (and/or e.g., via pins through which, in normal operation, the above-mentioned signals are output via the above-mentioned "south-bound channel" of the second bus 6b or the above-mentioned "north-bound channel" of the first bus 6a, etc.)).

The test method explained above by way of example may, in a correspondingly identical or similar manner as explained above, also be used in any other electronic systems in addition to the above-mentioned FB-DIMM memory module system 1, in one embodiment in electronic systems with hidden bidirectional signal paths, e.g., in memory module systems with registered DIMMs, or any other memory module systems, in flash cards, in microprocessor systems with microprocessor chip sets, etc.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claim is:

1. A test method comprising:
  sending out a test signal by a semiconductor device through a signal line;
  comparing a reflected signal generated in reaction to the test signal, or a signal generated therefrom, with a first threshold value;
  comparing the reflected signal or the signal generated therefrom with a second threshold value differing from the first threshold value; and
  determining an impedance profile of the signal line based on the comparisons.

2. The test method of claim 1, further comprising:
comparing the reflected signal or the signal generated therefrom with a third threshold value differing from the first and second threshold values.

3. The test method of claim 1, wherein the test signal comprises at least one test pulse.

4. The test method of claim 3, wherein the test signal comprises a plurality of test pulses.

5. The test method of claim 3, comprising:
comparing the reflected signal or the signal generated therefrom with the first threshold value at a first point in time after sending out a test pulse; and
comparing the reflected signal or the signal generated therefrom with the first threshold value at a second point in time differing from the first point in time after sending out the test pulse or a further test pulse.

6. The test method of claim 5, which additionally comprises:
comparing the reflected signal or the signal generated therefrom with the first threshold value at a third point in time differing from the first and second points in time after sending out the test pulse or the further test pulse or an additional test pulse.

7. The test method of claim 5, comprising:
comparing the reflected signal or the signal generated therefrom with the second threshold value at the first point in time; and
comparing the reflected signal or the signal generated therefrom with the second threshold value at the second point in time differing from the first point in time.

8. The test method of claim 7, which additionally comprises:
comparing the reflected signal or the signal generated therefrom with the second threshold value at the third point in time differing from the first and second points in time.

9. The test method of claim 5, wherein the semiconductor device is a data buffer device.

10. The test method of claim 9, comprising incorporating the data buffer device in a memory module.

11. The test method of claim 9, comprising sending out the test signal by a driver using the data buffer device which is used in normal operation of the data buffer device for sending out signals to a memory device.

12. The test method of claim 9, comprising comparing the reflected signal or the signal generated therefrom with the first and/or second threshold values by a receiver using the data buffer device which is used in normal operation of the data buffer device for receiving signals from a memory device.

13. The test method of claim 9, comprising inputting a signal controlling the test signal in the data buffer device via a pin that is used in normal operation of the data buffer device for exchanging signals with a further data buffer device or a memory controller.

14. A test device which is designed and equipped such that a test method of claim 1 can be performed with the test device.

15. A semiconductor device comprising:
a driver for sending out a test signal through a signal line;
a receiver for comparing a reflected signal generated in reaction to the test signal or a signal generated therefrom with a first threshold value and a second threshold value differing from the first threshold value; and
a circuit configured to determine an impedance profile of the signal line based on the comparisons.

16. The semiconductor device of claim 15, wherein the semiconductor device is configured as a data buffer device.

17. A test system comprising:
a semiconductor device including a driver configured to send out a test signal over a signal line;
a first circuit configured to compare a reflected signal generated in response to the test signal, with a first threshold value, and compare the reflected signal with a second threshold value differing from the first threshold value; and
a second circuit configured to determine an impedance profile of the signal line based on the comparisons.

18. The test system of claim 17, further comprising:
a pulse generation circuit configured to provide an input signal to the driver.

19. The test system of claim 17, wherein the second circuit is configured to set the first threshold value and the second threshold value at different points in time.

20. The test system of claim 17, wherein the first circuit is configured to compare the reflected signal with a third threshold value differing from the first and second threshold values.

* * * * *